(12) United States Patent
Jeong et al.

(10) Patent No.: US 8,815,489 B2
(45) Date of Patent: Aug. 26, 2014

(54) POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

(75) Inventors: Ji-Young Jeong, Uiwang-si (KR);
Jin-Young Lee, Uiwang-si (KR);
Jong-Hwa Lee, Uiwang-si (KR);
Hyun-Yong Cho, Uiwang-si (KR);
Sang-Soo Kim, Uiwang-si (KR);
Eun-Kyung Yoon, Uiwang-si (KR);
Jun-Ho Lee, Uiwang-si (KR);
Myoung-Hwan Cha, Uiwang-si (KR);
Eun-Ha Hwang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/590,330

(22) Filed: Aug. 21, 2012

(65) Prior Publication Data

US 2013/0137036 A1 May 30, 2013

(30) Foreign Application Priority Data

Nov. 29, 2011 (KR) ........................ 10-2011-0126315

(51) Int. Cl.
*G03F 7/023* (2006.01)

(52) U.S. Cl.
CPC .................................. *G03F 7/0236* (2013.01)
USPC ............. 430/191; 430/18; 430/165; 430/192; 430/193

(58) Field of Classification Search
CPC .................................................... G03F 7/0236
USPC ............................ 430/18, 165, 191, 192, 193
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore et al. | |
| 3,669,658 A | 6/1972 | Yonezawa et al. | |
| 5,114,826 A | 5/1992 | Kwong et al. | |
| 5,153,096 A | 10/1992 | Uenishi et al. | |
| 5,204,225 A | 4/1993 | Feely | |
| 5,376,499 A * | 12/1994 | Hammerschmidt et al. | 430/192 |
| 5,449,584 A | 9/1995 | Banba et al. | |
| 5,486,447 A | 1/1996 | Hammerschmidt et al. | |
| 6,001,517 A | 12/1999 | Kawamonzen | |
| 6,207,356 B1 | 3/2001 | Banba et al. | |
| 6,376,151 B1 | 4/2002 | Takahasi et al. | |
| 6,929,890 B2 | 8/2005 | Miyoshi et al. | |
| 6,929,891 B2 * | 8/2005 | Rushkin et al. | 430/18 |
| 7,056,641 B2 | 6/2006 | Naiini et al. | |
| 7,435,525 B2 | 10/2008 | Hattori et al. | |
| 7,674,566 B2 * | 3/2010 | Shibui | 430/191 |
| 8,198,002 B2 * | 6/2012 | Jung et al. | 430/191 |
| 8,420,287 B2 * | 4/2013 | Jeong et al. | 430/191 |
| 2004/0142275 A1 | 7/2004 | Komatsu | |
| 2004/0229167 A1 | 11/2004 | Naiini et al. | |
| 2010/0099041 A1 | 4/2010 | Fujita et al. | |
| 2011/0159428 A1 | 6/2011 | Lee et al. | |

FOREIGN PATENT DOCUMENTS

| | | |
|---|---|---|
| CN | 1469198 A | 1/2004 |
| CN | 1536442 A | 10/2004 |
| CN | 101727006 A | 6/2010 |
| CN | 102109763 A | 6/2011 |
| EP | 0695740 A1 | 2/1996 |
| JP | 63-096162 A | 4/1988 |
| JP | 01-189644 A | 7/1989 |
| JP | 07-175214 A | 7/1995 |
| JP | 09-302221 A | 11/1997 |
| JP | 10-307393 A | 11/1998 |
| JP | 11-202488 A | 7/1999 |
| JP | 2000-292913 A | 10/2000 |
| JP | 2002-241611 A | 8/2002 |
| JP | 2004-132996 A | 4/2004 |
| JP | 2005-338481 A | 12/2005 |
| JP | 2009-057458 A | 3/2009 |
| JP | 2009-282084 A | 12/2009 |
| KR | 1994-0005614 | 6/1994 |
| KR | 1994-0011202 | 11/1994 |
| KR | 10-1996-0007553 | 3/1996 |
| KR | 10-2003-0018153 A | 3/2003 |
| KR | 10-2006-0085629 A | 7/2006 |
| KR | 10-2009-0056737 A | 6/2009 |
| KR | 10-2011-0076492 A | 7/2011 |
| TW | 200842498 A | 11/2008 |

OTHER PUBLICATIONS

Office Action in commonly owned U.S. Appl. No. 13/590,440 mailed on Nov. 26, 2013, pp. 1-11.
Search Report in counterpart Taiwanese Application No. 101128764 dated Apr. 29, 2014, pp. 1.
English-translation Search Report in counterpart Taiwanese Application No. 101128764 dated Apr. 29, 2014, pp. 1.
Search Report in counterpart Chinese Application No. 2012102722747 dated Mar. 21, 2014, pp. 1-3.
English-translation of Search Report in counterpart Chinese Application No. 2012102722747 dated Mar. 21, 2014, pp. 1-2.

* cited by examiner

*Primary Examiner* — John Chu
(74) *Attorney, Agent, or Firm* — Additon, Higgins, Pendleton & Ashe, P.A.

(57) ABSTRACT

Disclosed are a positive photosensitive resin composition that includes (A) a polybenzoxazole precursor including a first polybenzoxazole precursor including a repeating unit represented by the following Chemical Formula 1 and a repeating unit represented by the following Chemical Formula 2, and having a thermally polymerizable functional group at at least one of the terminal end; (B) a dissolution controlling agent including a novolac resin including a repeating unit represented by the following Chemical Formula 4; (C) a photosensitive diazoquinone compound; (D) a silane compound; (E) an acid generator; and (F) a solvent, a photosensitive resin film prepared using the same, and a semiconductor device including the photosensitive resin film.

16 Claims, No Drawings

POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

CROSS-REFERENCE TO RELATED APPLICATION

This application claims priority to and the benefit of Korean Patent Application No. 10-2011-0126315 filed in the Korean Intellectual Property Office on Nov. 29, 2011, the entire disclosure of which is incorporated herein by reference.

FIELD

This disclosure relates to positive photosensitive resin composition, photosensitive resin film prepared using the same, and a semiconductor device including the photosensitive resin film.

BACKGROUND

Liquid crystal displays (LCDs) are widely available as flat panel displays. Recently organic light emitting diodes (OLEDs) have drawn attention as devices which can have high luminance and full color display.

Organic light emitting display devices include organic light emitting diodes including a hole injection electrode and an organic emission layer, and an electron injection electrode. Each organic light emitting diode emits light by energy generated when exciton produced by binding electrons and holes in the organic emission layer falls from the exited state into the ground state, and the organic light emitting diode (OLED) display displays the predetermined image by using the light emitting. For example, in order to provide a pixelated organic light emitting diode (OLED) display such as a television, a computer monitor, a mobile phone display, or a digital camera display, each organic light emitting diode may be arranged as a pixel having a matrix format. The pixels may be fabricated to emit the same color, so as to provide a monocolor display device; or the pixels may be fabricated to emit various different colors, for example to provide a red, green, and blue display device. The organic light emitting diode is self light emitting type, so a backlight unit for emitting light is not required unlike a liquid crystal display (LCD). Thereby, the thickness and the weight thereof may be reduced to a level of about 30% of the liquid crystal display.

Polyimide resins have received attention as an insulation layer material for the organic light emitting display device. Polyimide resins can have excellent heat resistance and stability at processes conducted at a temperature above 200° C., excellent mechanical strength, and a low dielectric constant (low-k). Polyimide resins can also provide smooth coating surfaces, lower the amount of impurities, which may deteriorate the reliability of device, and easily provide a fine pattern.

The conventional method of manufacturing an insulation layer or a semiconductor protective layer of an organic light emitting display device using the polyimide includes an additional photoresist process including, for example, etching with an organic solvent after patterning. Thus, the process is complicated; the cost is increased; the environment is contaminated by using the organic solvent; and the resist pattern may be swelled. In order to solve these problems, a negative photosensitive polyimide in which the etching solution is substituted with an alkali aqueous solution has been researched. However, in this case, the patterning can be deteriorated by non-crosslinked residue in the exposed region during the development, so that it can be difficult to achieve high resolution. Therefore, there is a need to develop a positive photosensitive polyimide which may achieve high-resolution.

Positive photosensitive resin compositions can have advantages such as providing a high contrast between the exposure part and non-exposed part by the interaction of novolac resin and a photo-sensitive agent. Heat resistance, however, is relatively low, so the pattern maintaining performance may be too decreased to ensure reliability.

In order to solve these problems, novolac resin can be mixed with polyamic acid or a polyamic acid-polyimide copolymer or the like and associated with a photo-sensitive agent of diazonaphtoquinone. It can still be difficult, however, to achieve high resolution and high sensitivity since the dissolubility difference of between an exposed region and non-exposed region is not controlled.

Accordingly, there is still a need for a positive photosensitive resin composition that can provide easy control of the dissolubility to the alkali aqueous solution of an exposed region and non-exposed region and that can provide excellent chemical resistance and heat resistance and high sensitivity.

SUMMARY OF THE INVENTION

One embodiment provides a positive photosensitive resin composition that can have excellent sensitivity, resolution, pattern shaping properties, residue removal properties, and reliability by including a polybenzoxazole precursor having a predetermined functional group and a dissolution controlling agent including a novolac resin having a predetermined structure.

Another embodiment provides a photosensitive resin film prepared using the positive photosensitive resin composition.

Yet another embodiment provides a semiconductor device including the photosensitive resin film.

According to one embodiment, provided is a positive photosensitive resin composition that includes (A) a polybenzoxazole precursor including a first polybenzoxazole precursor including a repeating unit represented by the following Chemical Formula 1 and a repeating unit represented by the following Chemical Formula 2, and having a thermally polymerizable functional group at at least one of the terminal end; (B) a dissolution controlling agent including a novolac resin including a repeating unit represented by the following Chemical Formula 4; (C) a photosensitive diazoquinone compound; (D) a silane compound; (E) an acid generator; and (F) a solvent.

[Chemical Formula 1]

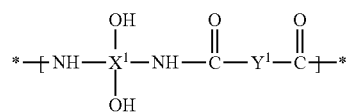

[Chemical Formula 2]

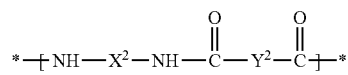

In Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a functional group represented by the following Chemical Formula 3, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 3]

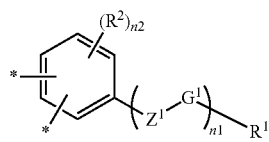

In Chemical Formula 3, $Z^1$ is the same or different in each repeating unit and is each independently a single bond, —O—, —COO—, —COO—, —NH—, —CONH—, substituted or unsubstituted C1 to C15 alkylene, substituted or unsubstituted C2 to C15 alkenylene, or substituted or unsubstituted C2 to C15 alkynylene, $G^1$ is the same or different in each repeating unit and is each independently a single bond, a substituted or unsubstituted C6 to C30 aromatic organic group, a substituted or unsubstituted divalent to hexavalent C3 to C30 alicyclic organic group, or a substituted or unsubstituted divalent to hexavalent C2 to C30 heterocyclic group, $R^1$ is the same or different in each repeating unit and is each independently hydrogen, fluorine, a hydroxyl group, a thiol group, a substituted or unsubstituted C1 to C30 carboxyl group, or a substituted or unsubstituted C1 to C30 aliphatic organic group, each $R^2$ is the same or different in each repeating unit and is each independently hydrogen, substituted or unsubstituted C1 to C30 alkyl, a substituted or unsubstituted C1 to C30 carboxyl group, a hydroxy group, or a thiol group, $n_1$ is an integer ranging from 1 to 5, and $n_2$ is an integer ranging from 0 to 3.

[Chemical Formula 4]

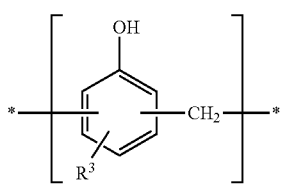

In Chemical Formula 4, $R^3$ is the same or different in each repeating unit and is a substituted or unsubstituted C1 to C20 aliphatic organic group, Greater than or equal to about 50 mol % of $R^3$ based on 100 mol % of $R^3$ in a repeating unit included in the novolac resin may be present in a meta position with respect to a hydroxy group (OH).

In one embodiment, the functional group represented by the above Chemical Formula 3 may include one selected from functional groups represented by the following Chemical Formulae 7 to 14 and combinations thereof.

[Chemical Formula 7]

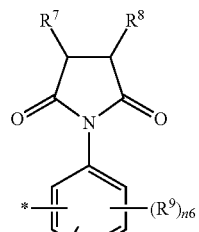

[Chemical Formula 8]

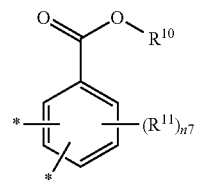

[Chemical Formula 9]

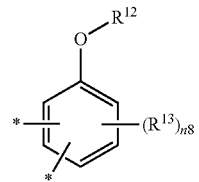

[Chemical Formula 10]

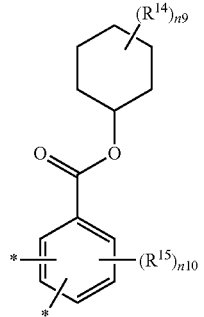

[Chemical Formula 11]

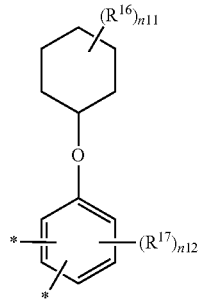

[Chemical Formula 12]

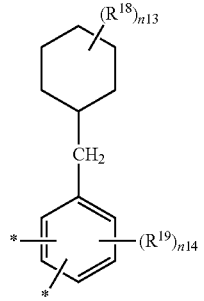

-continued

[Chemical Formula 13]

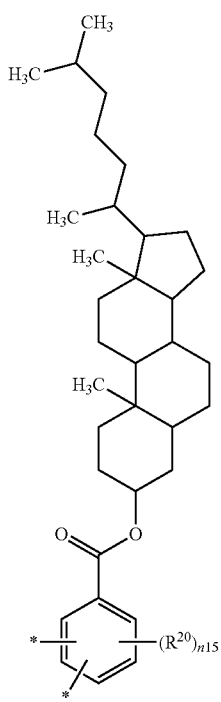

[Chemical Formula 14]

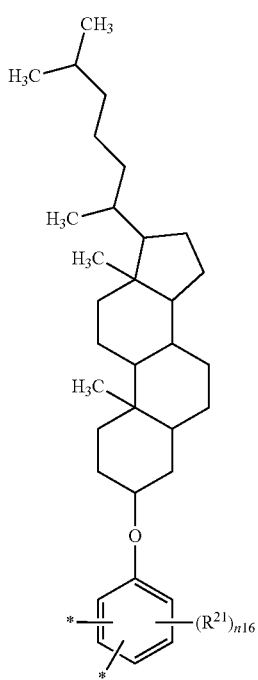

In Chemical Formulae 7 to 14, $R^7$, $R^8$, $R^{10}$, $R^{12}$, $R^{14}$, $R^{16}$ and $R^{18}$ are the same or different in each repeating unit and are each independently hydrogen, fluorine, a hydroxy group, a thiol group, a substituted or unsubstituted C1 to C30 carboxyl group, or a substituted or unsubstituted C1 to C30 aliphatic organic group, $R^9$, $R^{11}$, $R^{13}$, $R^{15}$, $R^{17}$, $R^{19}$, $R^{20}$ and $R^{21}$ are the same or different in each repeating unit and are each independently hydrogen, substituted or unsubstituted C1 to C30 alkyl, a substituted or unsubstituted C1 to C30 carboxyl group, a hydroxy group, or a thiol group, $n_9$, $n_{11}$ and $n_{13}$ are each independently an integer ranging from 0 to 11, and $n_6$, $n_7$, $n_8$, $n_{10}$, $n_{12}$, $n_{14}$, $n_{15}$ and $n_{16}$ are each independently an integer ranging from 0 to 3.

Greater than or equal to about 60 mol % of $R^3$ based on 100 mol % of $R^3$ in a repeating unit included in the novolac resin may be present in a meta position with respect to a hydroxy group (OH).

Greater than or equal to about 90 mol % of $R^3$ based on 100 mol % of $R^3$ in a repeating unit included in the novolac resin may be present in a meta position and a para position with respect to a hydroxy group (OH).

$R^3$ in a repeating unit included in the novolac resin may have a mole ratio of presenting in a meta position ($R^3_m$) and presenting in a para position ($R^3_p$) of about 5:5 to about 10:0, for example, about 6:4 to about 9:1.

Examples of the solvent may include without limitation γ-butyrolactone, ethyl lactate, propyleneglycol monomethylether, and the like, and combinations thereof.

The first polybenzoxazole precursor may include a repeating unit represented by above Chemical Formula 1 and a repeating unit represented by above Chemical Formula 2 at a mole ratio of about 60:40 to about 95:5.

The first polybenzoxazole precursor may have a weight average molecular weight (Mw) of about 4,000 g/mol to about 20,000 g/mol.

The polybenzoxazole precursor may further include a second polybenzoxazole precursor including a repeating unit represented by the following Chemical Formula 33, and having a thermally polymerizable functional group at at least one of the terminal end.

[Chemical Formula 33]

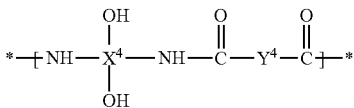

In Chemical Formula 33, $X^4$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The second polybenzoxazole precursor may have a weight average molecular weight (Mw) of about 4,000 g/mol to about 20,000 g/mol.

The polybenzoxazole precursor may include the first polybenzoxazole precursor and the second polybenzoxazole precursor at a weight ratio of about 5:95 to about 95:5.

The positive photosensitive resin composition may include about 1 part by weight to about 30 parts by weight of the dissolution controlling agent (B); about 5 parts by weight to about 100 parts by weight of the photosensitive diazoquinone compound (C); about 0.1 parts by weight to about 30 parts by weight of the silane compound (D); about 0.1 parts by weight to about 20 parts by weight of the acid generator (E); and about 50 parts by weight to about 900 parts by weight of the solvent (F) based on about 100 parts by weight of the polybenzoxazole precursor (A).

According to another embodiment of the present invention, a photosensitive resin film fabricated the positive photosensitive resin composition is provided.

According to a further embodiment of the present invention, a semiconductor device including the photosensitive resin film is provided.

The semiconductor device may be an organic light emitting diode (OLED) or a liquid crystal display (LCD).

By using a positive photosensitive resin composition including a polybenzoxazole precursor having a predetermined functional group and a dissolution controlling agent including a novolac resin having a predetermined structure, the dissolution controlling effect may be improved; mechanical properties and reliability of films may be improved; excellent sensitivity, resolution, pattern shaping properties, and residue removal properties may be obtained; and moisture absorptivity may be decreased.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with at least one substituent comprising halogen (—F, —Br, —Cl, or —I), a hydroxy group, a nitro, a cyano group, an amino group ($NH_2$, $NH(R^{200})$, or $N(R^{201})(R^{202})$), wherein $R^{200}$, $R^{201}$ and $R^{202}$ are the same or different and are independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, substituted or unsubstituted heterocyclic group, or a combination thereof.

As used herein, when a specific definition is not otherwise provided, the term "alkyl" may refer to a C1 to C30 alkyl, for example C1 to C15 alkyl, the term "cycloalkylene" may refer to C3 to C30 cycloalkylene, for example C3 to C18 cycloalkylene, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, and the term "arylene" may refer to C6 to C30 arylene, for example C6 to C18 arylene.

As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, the term "heterocyclic group" may refer a C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms comprising O, S, N, P, Si, or a combination thereof in one ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms comprising O, S, N, P, Si, or a combination thereof in one ring.

As used herein, when a specific definition is not otherwise provided, the term "combination" refers to mixing or copolymerization. Also, the term "copolymerization" refers to block copolymerization, random copolymerization or graft copolymerization, and the term "copolymer" refers to a block copolymer, a random copolymer, or graft copolymer.

Also, "*" refers to a linking part between the same or different atoms, or chemical Formulae.

According to one embodiment, a positive photosensitive resin composition includes (A) a polybenzoxazole precursor including a first polybenzoxazole precursor including a repeating unit represented by the following Chemical Formula 1 and a repeating unit represented by the following Chemical Formula 2, and having a thermally polymerizable functional group at at least one of the terminal end, (B) a dissolution controlling agent including a novolac resin including a repeating unit represented by the following Chemical Formula 4, (C) a photosensitive diazoquinone compound, (D) a silane compound, (E) an acid generator, and (F) a solvent.

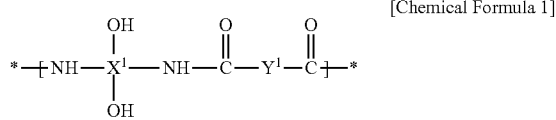

[Chemical Formula 1]

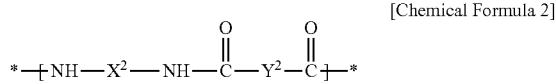

[Chemical Formula 2]

In Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit, and is independently a functional group represented by the following Chemical Formula 3, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 3]

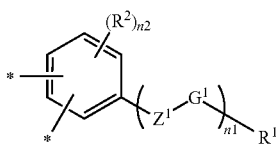

In Chemical Formula 3, $Z^1$ is the same or different in each repeating unit and is each independently a single bond, —O—, —COO—, —COO—, —NH—, —CONH—, substituted or unsubstituted C1 to C15 alkylene, substituted or unsubstituted C2 to C15 alkenylene, or substituted or unsubstituted C2 to C15 alkynylene, and in one embodiment, $Z^1$ is a single bond, —O—, —COO—, or C1 to C5 alkylene.

$G^1$ is the same or different in each repeating unit and is each independently a single bond, a substituted or unsubstituted C6 to C30 aromatic organic group, a substituted or unsubstituted divalent to hexavalent C3 to C30 alicyclic organic group, or a substituted or unsubstituted divalent to hexavalent C2 to C30 heterocyclic group, and in one embodiment, the aromatic organic group, alicyclic organic group and heterocyclic group may include at least one ring.

$R^1$ is the same or different in each repeating unit and is each independently hydrogen, fluorine, a hydroxy group, a thiol group, a substituted or unsubstituted C1 to C30 carboxyl group, or a substituted or unsubstituted C1 to C30 aliphatic organic group.

each $R^2$ is the same or different in each repeating unit and is each independently hydrogen, substituted or unsubstituted C1 to C30 alkyl, a substituted or unsubstituted C1 to C30 carboxyl group, a hydroxy group, or a thiol group.

$n_1$ is an integer ranging from 1 to 5, and $n_2$ is an integer ranging from 0 to 3.

Sometime the functional group represented by above Chemical Formula 3 may partially include a hydrophilic group, but it is generally hydrophobic, so as to suppress the dissolution of the positive photosensitive resin composition to the alkali developing solution.

When the positive photosensitive resin composition includes the first polybenzoxazole precursor including a functional group represented by above Chemical Formula 3, the dissolubility to the alkali developing solution may be effectively controlled in the exposed part and the non-exposed part. Thereby, the film residue ratio and the pattern shaping properties of film fabricated by using the positive photosensitive resin composition may be improved, and the residue may be effectively removed without scum to improve the residue removal properties. In addition, the mechanical properties, the reliability, the sensitivity and the resolution of film fabricated by using the positive photosensitive resin composition may be also improved.

[Chemical Formula 4]

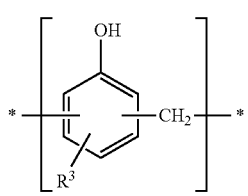

In Chemical Formula 4, $R^3$ is the same or different in each repeating unit and is a substituted or unsubstituted C1 to C20 aliphatic organic group, in one embodiment, substituted or unsubstituted C1 to C20 alkyl, and in another embodiment, methyl.

Greater than or equal to about 50 mol % of $R^3$ based on 100 mol % of $R^3$ in a repeating unit included in the novolac resin may be present in a meta position with respect to a hydroxy group (OH).

When the positive photosensitive resin composition includes the novolac resin, in the non-exposed part, the hydroxyl group of novolac resin forms a hydrogen bond with a polybenzoxazole precursor and a photosensitive diazoquinone compound, and $R^3$ of the novolac resin is non-polar, so the non-exposed part is not well dissolved in an alkali developing solution. On the other hand, the exposed part has polarity increased by a photosensitive diazoquinone compound, and thus, is well dissolved in an alkali developing solution. In this way, since the unexposed part is controlled to be non-polar, and the exposed part is controlled to be polar, the exposed part may have effectively improved alkali developability, sensitivity, and film residue ratio.

Non-polarity and polarity of the positive photosensitive resin composition may be identified by measuring a contact angle relative to water. Specifically, an unexposed part may have a contact angle relative to water in a range of about 65° to about 80°, and an exposed part may have a contact angle relative to water in a range of about 35° to about 60°.

The polybenzoxazole precursor is cross-linked with the novolac resin during thermal curing, and mechanical strength of a film fabricated using a positive photosensitive resin composition and residue removal properties may be improved.

As a result, the positive photosensitive resin composition may have excellent sensitivity, resolution, film residue ratios, pattern shaping properties and residue removal properties, and a photosensitive resin film fabricated using the positive photosensitive resin composition may have excellent mechanical properties.

The positive photosensitive resin composition may include (G) one or more other additives.

Hereinafter, each composition component is described in detail.

(A) Polybenzoxazole Precursor

The polybenzoxazole precursor may include the first polybenzoxazole precursor including the repeating unit represented by the above Chemical Formula 1 and the repeating unit represented by the above Chemical Formula 2, and having a thermally polymerizable functional group at at least one of the terminal end.

In Chemical Formula 1, $X^1$ is the same or different in each repeating unit, and is each independently an aromatic organic group, a tetravalent to hexavalent aliphatic organic group, or a tetravalent to hexavalent alicyclic organic group. In one embodiment, $X^1$ is the same or different in each repeating unit, and is each independently an aromatic organic group, or a tetravalent to hexavalent alicyclic organic group.

Specifically, $X^1$ may be a residual group derived from an aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)

hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

$X^1$ may be a functional group represented by the following Chemical Formulae 5 and 6, but is not limited thereto.

[Chemical Formula 5]

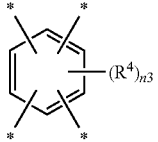

[Chemical Formula 6]

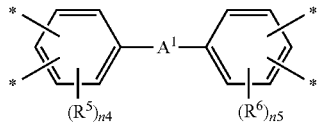

In Chemical Formulae 5 and 6, $A^1$ is —O—, —CO—, —CR$^{203}$R$^{204}$—, —SO$_2$—, —S—, or a single bond, wherein $R^{203}$ and $R^{204}$ are the same or different and are each independently hydrogen or substituted or unsubstituted alkyl, and in one embodiment fluoroalkyl, $R^4$ to $R^6$ are the same or different and are each independently hydrogen, substituted or unsubstituted alkyl, a substituted or unsubstituted carboxyl group, a hydroxy group, or a thiol group, $n_3$ is an integer ranging from 0 to 2, and $n_4$ and $n_5$ are the same or different and are each independently an integer ranging from 0 to 3.

In Chemical Formula 2, $X^2$ may be the same or different in each repeating unit, and is each independently a functional group represented by the above Chemical Formula 3.

In one embodiment, the functional group represented by the above Chemical Formula 3 may include one selected from functional groups represented by the following Chemical Formulae 7 to 14, or a combination thereof, but is not limited thereto.

[Chemical Formula 7]

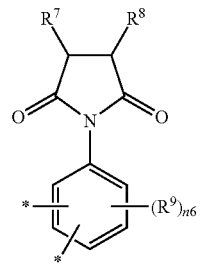

[Chemical Formula 8]

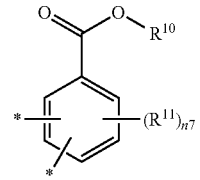

[Chemical Formula 9]

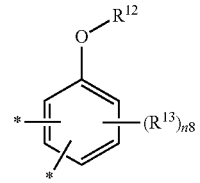

[Chemical Formula 10]

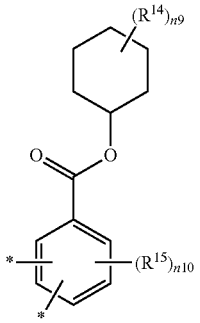

[Chemical Formula 11]

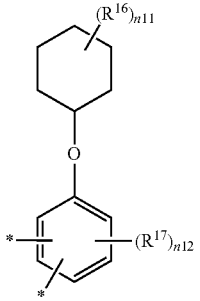

[Chemical Formula 12]

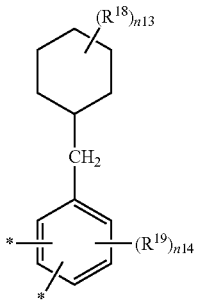

[Chemical Formula 13]

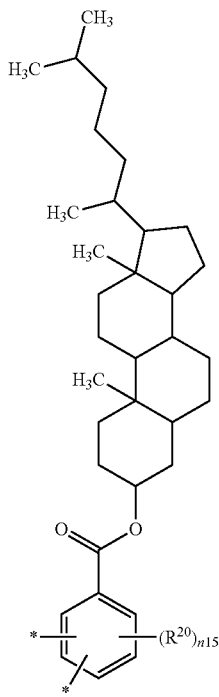

[Chemical Formula 14]

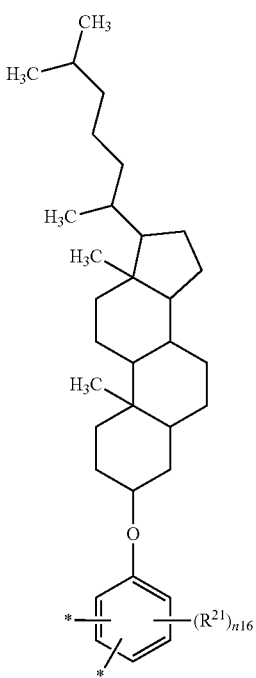

In Chemical Formulae 7 to 14, $R^7$, $R^8$ $R^{10}$, $R^{12}$, $R^{14}$, $R^{16}$ and $R^{18}$ are the same or different in each repeating unit and are each independently hydrogen, fluorine, a hydroxy group, a thiol group, a substituted or unsubstituted C1 to C30 carboxyl group, or a substituted or unsubstituted C1 to C30 aliphatic organic group, $R^9$, $R^{11}$, $R^{13}$, $R^{15}$, $R^{17}$, $R^{19}$, $R^{20}$ and $R^{21}$ are the same or different in each repeating unit and are each independently hydrogen, substituted or unsubstituted C1 to C30 alkyl, a substituted or unsubstituted C1 to C30 carboxyl group, a hydroxy group, or a thiol group, $n_9$, $n_{11}$ and $n_{13}$ are each independently an integer ranging from 0 to 11, and $n_6$, $n_7$, $n_8$, $n_{10}$, $n_{12}$, $n_{14}$, $n_{15}$ and $n_{16}$ are each independently an integer ranging from 0 to 3.

In one embodiment, the functional group represented by the above Chemical Formula 3 may be derived from 1-(3,5-diaminophenyl)-3-octadecyl succinimide, 4-octadecoxybenzene-1,3-diamine, 4-cholesteryloxy-1,3-benzenediamine, 4-cyclohexylmethyl-1,3-benzenediamine, 4-cyclohexyloxy-1,3-benzenediamine, 4-dodecyloxy-1,3-benzenediamine, or a combination thereof, without limitation.

In Chemical Formulae 1 and 2, $Y^1$ and $Y^2$ are the same or different and are independently an aromatic organic group, a divalent to hexavalent aliphatic organic group, or a divalent to hexavalent alicyclic organic group. In one embodiment, $Y^1$ and $Y^2$ are the same or different and are independently an aromatic organic group, or a divalent to hexavalent alicyclic organic group.

In another embodiment, $Y^1$ and $Y^2$ may be a residual group derived from a dicarboxylic acid or a residual group derived from a dicarboxylic acid derivative.

Examples of the dicarboxylic acid include without limitation $Y^1(COOH)_2$ or $Y^2(COOH)_2$ (wherein $Y^1$ and $Y^2$ are the same as $Y^1$ and $Y^2$ of the above Chemical Formulae 1 and 2).

Examples of the carboxylic acid derivative include without limitation carbonyl halide derivatives of $Y^1(COOH)_2$, carbonyl halide derivatives of $Y^2(COOH)_2$, active compounds of an active ester derivative obtained by reacting $Y^1(COOH)_2$ and 1-hydroxy-1,2,3-benzotriazole, or active compounds of an active ester derivative obtained by reacting $Y^2(COOH)_2$ with 1-hydroxy-1,2,3-benzotriazole (wherein $Y^1$ and $Y^2$ are the same as $Y^1$ and $Y^2$ of the above Chemical Formulae 1 and 2).

Examples of the dicarboxylic acid derivative include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

$Y^1$ and $Y^2$ may include functional groups represented by the following Chemical Formulae 15 to 17, but are not limited thereto.

[Chemical Formula 15]

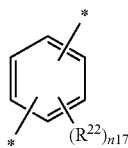

[Chemical Formula 16]

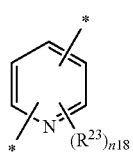

[Chemical Formula 17]

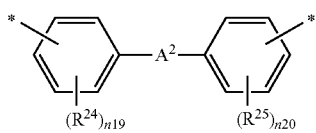

In Chemical Formulae 15 to 17, $R^{22}$ to $R^{25}$ are the same or different and are each independently hydrogen or substituted or unsubstituted alkyl, $n_{17}$ is an integer ranging from 0 to 4, $n_{18}$, $n_{19}$ and $n_{20}$ are each independently an integer ranging from 0 to 3, and $A^2$ is —O—, —CR$^{205}$R$^{206}$—, —CO—, —CONH—, —S—, —SO$_2$—, or a single bond, wherein $R^{205}$ and $R^{206}$ are the same or different and are each independently hydrogen or substituted or unsubstituted alkyl, and in one embodiment fluoroalkyl.

The first polybenzoxazole precursor includes a thermally polymerizable functional group at at least one of the terminal end. The thermally polymerizable functional group binds polymer chains by heat to extend a chain length, or is cross-linked with a cross-linking agent to provide a hard film, and therefore the molecular weight of a low molecular weight polymer can be increased and film properties can be improved.

The thermally polymerizable functional group may be derived from an end-capping monomer. Examples of the end-cappong monomer may include without limitation monoamines, monoanhydrides, monocarboxylic acid halides including a carbon-carbon multiple bond, and the like, and combinations thereof.

Examples of the monoamines include without limitation toluidine, dimethylaniline, ethylaniline, aminophenol, aminobenzylalcohol, aminoindan, aminoacetonephenone, and the like, and combinations thereof.

Examples of the monoanhydrides include without limitation 5-norbornene-2,3-dicarboxylanhydride represented by the following Chemical Formula 18, 3,6-epoxy-1,2,3,6-tetra hydrophthalicanhydride represented by the following Chemical Formula 19, isobutenyl succinic anhydride represented by the following Chemical Formula 20, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 18]

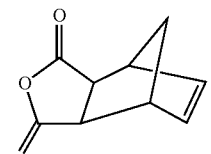

[Chemical Formula 19]

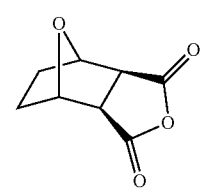

[Chemical Formula 20]

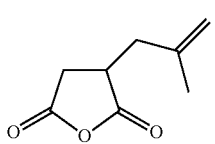

The thermally polymerizable functional group derived from the monoanhydrides can include a functional group represented by the following Chemical Formulae 21 to 25 or a combination thereof, but is not limited thereto. The thermally polymerizable functional group may be cross-linked during heating of the first polybenzoxazole precursor preparation process, and may be formed as a residual group at the terminal end of the first polybenzoxazole precursor.

[Chemical Formula 21]

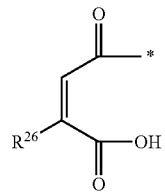

In Chemical Formula 21, $R^{26}$ is —H, —CH$_2$COOH or —CH$_2$CHCHCH$_3$.

[Chemical Formula 22]

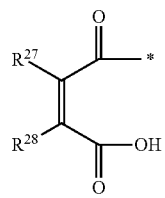

In Chemical Formula 22, $R^{27}$ and $R^{28}$ are the same or different and are each independently —H or —CH$_3$.

[Chemical Formula 23]

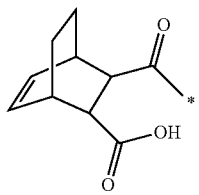

[Chemical Formula 24]

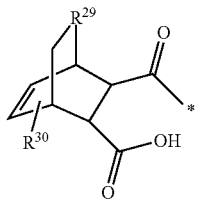

In Chemical Formula 24, $R^{29}$ is —CH$_2$— or —O—, and $R^{30}$ is —H or —CH$_3$.

[Chemical Formula 25]

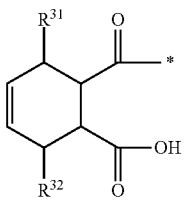

In Chemical Formula 25, $R^{31}$ and $R^{32}$ are the same or different, and are independently —H, —$CH_3$ or —$OCOCH_3$.

The monocarboxylic acid halides including the carbon-carbon multiple bonds may be represented by the following Chemical Formula 26.

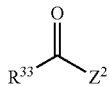

[Chemical Formula 26]

In Chemical Formula 26, $R^{33}$ is a substituted or unsubstituted alicyclic organic group or a substituted or unsubstituted aromatic organic group. The substituted alicyclic organic group or substituted aromatic organic group is substituted with a substituent including a substituted or unsubstituted amidino group, a substituted or unsubstituted alicyclic organic group, or a fused ring of a substituted or unsubstituted alicyclic organic group with an aryl group. The substituted alicyclic organic group may be a maleimide group.

$Z^2$ is —F, —Cl, —Br, or —I.

Examples of the monocarboxylic acid halides including a carbon-carbon multiple bond include without limitation 5-norbornene-2-carboxylic acid halides represented by the following Chemical Formula 27, 4-nadimido benzoylhalides represented by the following Chemical Formula 28, 4-(4-phenylethynylphthimido)benzoylhalides represented by the following Chemical Formula 29, 4-(2-phenylmaleicimido) benzoylhalides represented by the following Chemical Formula 30, benzoylhalides represented by the following Chemical Formula 31, cyclobenzoylhalides represented by the following Chemical Formula 32, 4-(3-phenylethynylphthimido)benzoylhalide, 4-maleimido benzoylhalide, and the like, and combinations thereof. These may be used singularly or as a mixture thereof.

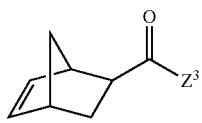

[Chemical Formula 27]

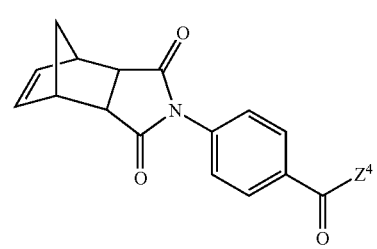

[Chemical Formula 28]

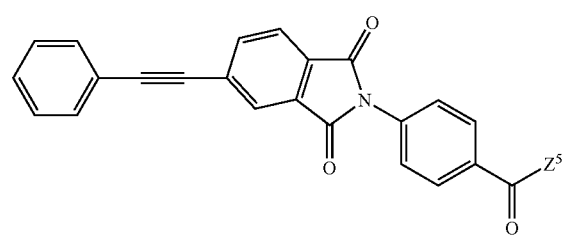

[Chemical Formula 29]

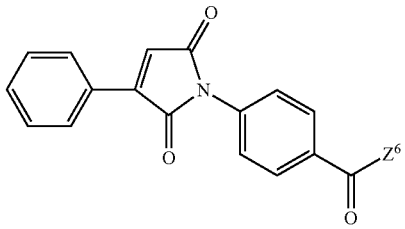

[Chemical Formula 30]

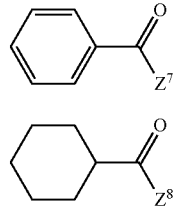

[Chemical Formula 31]

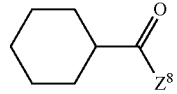

[Chemical Formula 32]

In Chemical Formulae 27 to 32, $Z^3$ to $Z^8$ are the same or different and are each independently —F, —Cl, —Br, or —I.

The first polybenzoxazole precursor may include the repeating unit represented by above Chemical Formula 1 and the repeating unit represented by above Chemical Formula 2 at a mole ratio of about 60:40 to about 95:5.

In some embodiments, the first polybenzoxazole precursor may include a repeating unit represented by above Chemical Formula 1 in an amount of about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 mole %. Further, according to some embodiments of the present invention, the amount of the repeating unit represented by above Chemical Formula 1 can be in a range from about any of the foregoing amounts to about any other of the foregoing amounts.

In some embodiments, the first polybenzoxazole precursor may include a repeating unit represented by above Chemical Formula 2 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 mole %. Further, according to some embodiments of the present invention, the amount of the repeating unit represented by above Chemical Formula 2 can be in a range from about any of the foregoing amounts to about any other of the foregoing amounts.

When the first polybenzoxazole precursor includes the repeating unit represented by above Chemical Formula 1 and the repeating unit represented by above Chemical Formula 2 in an amount within the above ranges, the dissolution of the positive photosensitive resin composition in the alkali developing solution may be suppressed in the non-exposed part. Thereby, the residue ratio and pattern formation properties of film fabricated by using the positive photosensitive resin composition may be effectively improved, and the residue may be effectively removed without scum, so the residue removal properties may be effectively improved. In addition, the mechanical properties, the reliability, the sensitivity and the resolution of film fabricated by using the positive photosensitive resin composition may be also improved.

The first polybenzoxazole precursor may have a weight average molecular weight (Mw) of about 4,000 g/mol to about 20,000 g/mol. When the first polybenzoxazole precursor has a weight average molecular weight within the above range, the development rate may be effectively controlled, so the pattern formation properties and the film residue ratio characteristics may be improved to provide the enough dissolubility to the organic solvent. In addition, it may be easily used in the positive photosensitive resin composition in the various mixing range. In one embodiment, the first polybenzoxazole precursor may have a weight average molecular weight (Mw) of about 5,000 g/mol to about 15,000 g/mol.

The polybenzoxazole precursor may further include a second polybenzoxazole precursor including a repeating unit represented by the following Chemical Formula 33, and having a thermally polymerizable functional group at at least one of the terminal end.

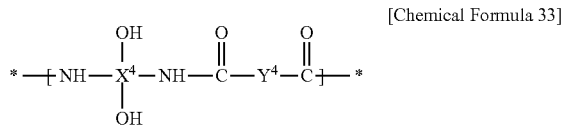

[Chemical Formula 33]

In Chemical Formula 33, $X^4$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

When the polybenzoxazole precursor further includes the second polybenzoxazole precursor, the developability in the non-exposed part and exposed part may be effectively controlled to enhance contrast ratio.

In Chemical Formula 33, $X^4$ is the same or different in each repeating unit and is each independently aromatic organic group, tetravalent to hexavalent aliphatic organic group, or a tetravalent to hexavalent alicyclic organic group. In one embodiment, $X^4$ is the same or different in each repeating unit and is each independently aromatic organic group or a tetravalent to hexavalent alicyclic organic group.

In one embodiment, $X^4$ may be a residual group derived from aromatic diamine.

The aromatic diamine is the same as the aromatic diamine in the description of $X^1$ of the above Chemical Formula 1.

$X^4$ may be a functional group represented by the above Chemical Formulae 5 and 6, but is not limited thereto.

In Chemical Formula 33, $Y^4$ is the same or different and is independently an aromatic organic group, a divalent to hexavalent aliphatic organic group, or a divalent to hexavalent alicyclic organic group. In one embodiment, $Y^4$ is the same or different, and is each independently an aromatic organic group or a divalent to hexavalent alicyclic organic group.

In another embodiment, $Y^4$ is a residual group derived from dicarboxylic acid or a residual group derived from a dicarboxylic acid derivative.

The dicarboxylic acid may be $Y^4(COOH)_2$ (wherein $Y^4$ is the same as $Y^4$ of the above Chemical Formula 33).

Examples of the carboxylic acid derivative may include without limitation carbonyl halide derivatives of $Y^4(COOH)_2$, active compounds of an active ester derivative obtained by reacting $Y^4(COOH)_2$ (wherein $Y^4$ is the same as $Y^4$ of the above Chemical Formula 33) and 1-hydroxy-1,2,3-benzotriazole, and the like, and combinations thereof.

Examples of the dicarboxylic acid derivative are the same as described above.

$Y^4$ may be a functional group represented by the above Chemical Formulae 15 to 17, but is not limited thereto.

The second polybenzoxazole precursor may have a weight average molecular weight (Mw) of about 4,000 g/mol to about 20,000 g/mol. When the second polybenzoxazole precursor compound has a weight average molecular weight within the above range, the development rate may be effectively controlled to improve the pattern formation properties and the film residue ratio characteristics and may be easily used in the positive photosensitive resin composition in various mixing ranges. In one embodiment, the second polybenzoxazole precursor may have a weight average molecular weight (Mw) of about 5,000 g/mol to about 15,000 g/mol.

When the polybenzoxazole precursor includes both of the first polybenzoxazole precursor and the second polybenzoxazole precursor, the first polybenzoxazole precursor and the second polybenzoxazole precursor may be included at a weight ratio of about 5:95 to about 95:5.

In some embodiments, the polybenzoxazole precursor may include the first polybenzoxazole precursor in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 weight %. Further, according to some embodiments of the present invention, the amount of the first polybenzoxazole precursor can be in a range from about any of the foregoing amounts to about any other of the foregoing amounts.

In some embodiments, the polybenzoxazole precursor may include the second polybenzoxazole precursor in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 weight %. Further, according to some embodiments of the present invention, the amount of the second polybenzoxazole precursor can be in a range from about any of the foregoing amounts to about any other of the foregoing amounts.

When the first polybenzoxazole precursor and the second polybenzoxazole precursor are included in amounts within the above ranges, the developability may be effectively controlled in the non-exposed part and the exposed part to improve the sensitivity and the film residue ratio characteristics.

(B) Dissolution Controlling Agent

The dissolution controlling agent includes a novolac resin including the repeating unit represented by the above Chemical Formula 4. As used herein, the novolac resin may be a random copolymer, a block copolymer, or a combination thereof, but is not limited thereto. In one embodiment, the novolac resin can be a random copolymer.

Greater than or equal to about 50 mol % of $R^3$ based on 100 mol % of $R^3$ in a repeating unit included in the novolac resin may be present in a meta position with respect to a hydroxy group (OH).

In one embodiment, in the positive photosensitive resin composition, greater than or equal to about 60 mol % of $R^3$ based on 100 mol % of $R^3$ in a repeating unit included in the novolac resin may be present in a meta position with respect to a hydroxy group (OH).

In some embodiments, the novolac resin may include a repeating unit represented by the above Chemical Formula 3 having $R^3$ present in a meta position relative to a hydroxy group (OH) in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 mol %. Further, according to some embodiments of the present invention, the amount of the repeating unit having $R^3$ present in a meta position relative to a hydroxy group (OH) can be in a range from about any of the foregoing amounts to about any other of the foregoing amounts.

In exemplary embodiments, in the positive photosensitive resin composition, greater than or equal to about 90 mol % of $R^3$ based on 100 mol % of $R^3$ in a repeating unit included in the novolac resin may be present in a meta position and a para position with respect to a hydroxy group (OH).

In some embodiments, the novolac resin may include a repeating unit represented by the above Chemical Formula 3 having $R^3$ present in a meta position and a para position relative to a hydroxy group (OH) in an amount of about 90, 91, 92, 93, 94, 95, 96, 97, 98, 99, or 100 mol %. Further, according to some embodiments of the present invention, the amount of the repeating unit having $R^3$ present in a meta position and a para position relative to a hydroxy group (OH) can be in a range from about any of the foregoing amounts to about any other of the foregoing amounts.

In this case, the repeating unit including $R^3$ present the meta position ($R^3_m$) and the repeating unit including $R^3$ present in the para position ($R^3_p$) may be random polymerized or block polymerized, but is not limited thereto. In this case, $R^3$ present the meta position ($R^3_m$) may improve the alkali developability and the sensitivity in the exposed part, and $R^3$ present in the para position ($R^3_p$) may suppress the excessive development in the exposed part and the non-exposed part, so the film residue ratio characteristics may be maintained. Thereby, the alkali developabiity may be effectively controlled when using the positive photosensitive resin composition, so the sensitivity and the film residue ratio characteristics may be improved.

The repeating unit included in the novolac resin may include $R^3_m$ present in a metal position and $R^3_p$ present in a para position to the hydroxyl group (OH) in the $R^3$ in a mole ratio of about 5:5 to about 10:0.

In some embodiments, the repeating unit included in the novolac resin may include $R^3_m$ present in a meta position to the hydroxyl group (OH) in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 mol %. Further, according to some embodiments of the present invention, the amount of $R^3_m$ present in a meta position can be in a range from about any of the foregoing amounts to about any other of the foregoing amounts.

In some embodiments, the repeating unit included in the novolac resin may include $R^3_p$ present in a para position to the hydroxyl group (OH) in an amount of about zero (a repeating unit represented by the above Chemical Formula 3 having $R^3_p$ is not present), or about 0 (a repeating unit represented by the above Chemical Formula 3 having $R^3_p$ is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 mol %. Further, according to some embodiments of the present invention, the amount of $R^3_p$ present in a para position can be in a range from about any of the foregoing amounts to about any other of the foregoing amounts.

In this case, the repeating unit including $R^3$ present the meta position ($R^3_m$) and the repeating unit including $R^3$ present in the para position ($R^3_p$) may be random polymerized or block polymerized, but is not limited thereto. When the mole ratio of $R^3$ present the meta position ($R^3_m$) and $R^3$ present in the para position ($R^3_p$) is within the above range, the alkali developabiity may be effectively controlled if using the positive photosensitive resin composition, and the sensitivity, the film residue ratio characteristics, and the heat resistance may be improved. In one embodiment, the mole ratio of $R^3$ present the meta position ($R^3_m$) and $R^3$ present in the para position ($R^3_p$) may range from about 6:4 to about 9:1.

The novolac resin may include a compound including a repeating unit represented by the following Chemical Formula 34.

[Chemical Formula 34]

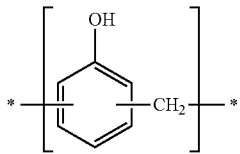

The novolac resin may include the compound including the repeating unit represented by the Chemical Formula 4 and the compound including the repeating unit represented by the above Chemical Formula 34 at a weight ratio of about 30:70 to about 90:10.

In some embodiments, the novolac resin may include the compound including the repeating unit represented by the Chemical Formula 4 in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 weight %. Further, according to some embodiments of the present invention, the amount of the compound including the repeating unit represented by the Chemical Formula 4 can be in a range from about any of the foregoing amounts to about any other of the foregoing amounts.

In some embodiments, the novolac resin may include the compound including the repeating unit represented by the Chemical Formula 34 in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 weight %. Further, according to some embodiments of the present invention, the amount of the compound including the repeating unit represented by the Chemical Formula 34 can be in a range from about any of the foregoing amounts to about any other of the foregoing amounts.

Alternatively, the novolac resin may include the repeating unit represented by the Chemical Formula 4 and the repeating unit represented by the above Chemical Formula 34 at a mole ratio of about 30:70 to about 90:10.

In some embodiments, the novolac resin may include the repeating unit represented by the Chemical Formula 4 in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 mol %. Further, according to some embodiments of the present invention, the amount of the repeating unit represented by the Chemical Formula 4 can be in a range from about any of the foregoing amounts to about any other of the foregoing amounts.

In some embodiments, the novolac resin may include the repeating unit represented by the Chemical Formula 34 in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 mol %. Further, according to some embodiments of the present invention, the amount of the repeating unit represented by the Chemical Formula 34 can be in a range from about any of the foregoing amounts to about any other of the foregoing amounts.

When the novolac resin includes the cresol novolac repeating unit represented by above Chemical Formula 4 and the phenol novolac repeating unit represented by above Chemical Formula 34 in an amount within the above range, the dissolubility to the alkali developing solution may be improved in the exposed part while maintaining dissolution suppression in the non-exposed part, so the developability may be effectively improved in the exposed part to improve film residue ratio, sensitivity, and pattern formation properties. In one embodiment, the novolac resin may include the repeating unit represented by the Chemical Formula 4 and the repeating unit represented by the above Chemical Formula 34 in a mole ratio of about 40:60 to about 80:20.

The novolac resin may have a number average molecular weight (Mn) of about 1,000 to about 10,000.

The dissolution controlling agent may further include a phenol compound.

The phenol compound may include compounds represented by the following Chemical Formulae 35 to 41, and combinations thereof, but is not limited thereto.

[Chemical Formula 35]

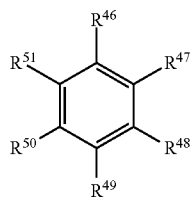

In Chemical Formula 35,
$R^{46}$ to $R^{51}$ are the same or different and are each independently —H, —OH, substituted or unsubstituted C1 to C10 alkyl, substituted or unsubstituted C1 to C10 alkoxy, or substituted or unsubstituted C1 to C10 alkoxyalkyl, provided that at least one of $R^{46}$ to $R^{51}$ is a hydroxy group, and all of $R^{46}$ to $R^{51}$ are not a hydroxy group.

[Chemical Formula 36]

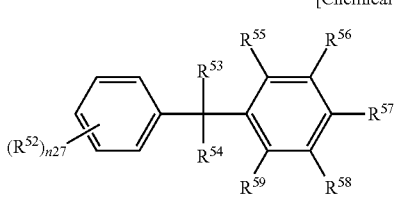

In Chemical Formula 36,
$R^{52}$ to $R^{54}$ are the same or different and are each independently hydrogen or substituted or unsubstituted alkyl, $R^{55}$ to $R^{59}$ are the same or different and are each independently —H, —OH, or substituted or unsubstituted alkyl, provided that at least one of $R^{55}$ to $R^{59}$ is a hydroxy group, and in one embodiment, the alkyl may be —CH$_3$, and
$n_{27}$ is an integer ranging from 0 to 5.

[Chemical Formula 37]

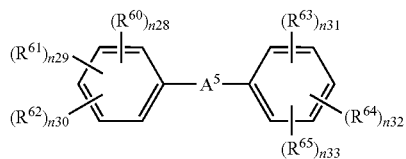

In Chemical Formula 37,
$R^{60}$ to $R^{65}$ are the same or different and are each independently —H, —OH, or substituted or unsubstituted alkyl, provided that at least one of $R^{60}$ to $R^{65}$ is a hydroxy group,
$A^5$ is —CR$^{209}$R$^{210}$— or a single bond, wherein $R^{209}$ and $R^{210}$ are the same or different and are each independently hydrogen or substituted or unsubstituted alkyl, and in one embodiment the alkyl may be —CH$_3$, and
$n_{28}+n_{29}+n_{30}$ and $n_{31}+n_{32}+n_{33}$ are the same or different and are each independently an integer of less than or equal to 5.

[Chemical Formula 38]

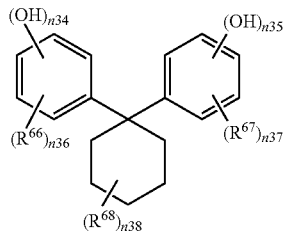

In Chemical Formula 38,
$R^{66}$ to $R^{68}$ are the same or different and are each independently hydrogen or substituted or unsubstituted alkyl,
$n_{34}$ and $n_{35}$ are the same or different and are each independently an integer ranging from 1 to 5,
$n_{36}$ and $n_{37}$ are the same or different and are each independently an integer ranging from 0 to 4, and
$n_{38}$ is an integer ranging from 0 to 10.

[Chemical Formula 39]

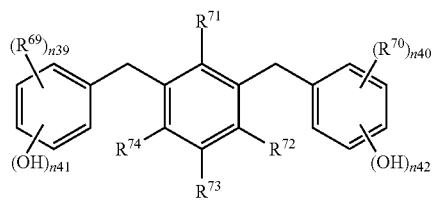

In Chemical Formula 39,
$R^{69}$ to $R^{74}$ are the same or different and are each independently hydrogen, —OH, or substituted or unsubstituted alkyl,
$n_{39}$ to $n_{42}$ are the same or different and are each independently an integer ranging from 1 to 4, and
$n_{39}+n_{41}$ and $n_{40}+n_{42}$ are the same or different and are each independently an integer of less than or equal to 5.

[Chemical Formula 40]

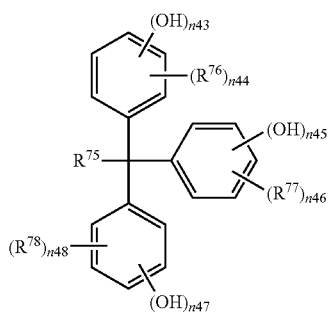

In Chemical Formula 40, $R^{75}$ is substituted or unsubstituted alkyl, for example —CH$_3$, $R^{76}$ to $R^{78}$ are the same or different and are each independently hydrogen or substituted or unsubstituted alkyl, $n_{43}$, $n_{45}$ and $n_{47}$ are the same or different and are each independently an integer ranging from 1 to 5, $n_{44}$, $n_{46}$ and $n_{48}$ are the same or different and are each independently an integer ranging from 0 to 4, and $n_{43}+n_{44}$, $n_{45}+n_{46}$ and $n_{47}+n_{48}$ are the same or different and are each independently an integer of less than or equal to 5.

[Chemical Formula 41]

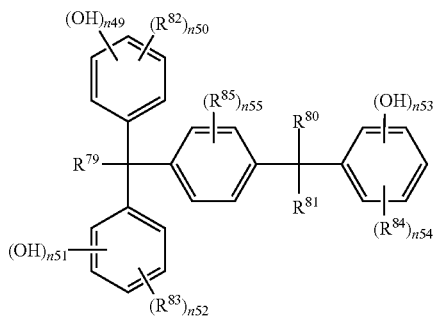

In Chemical Formula 41, $R^{79}$ to $R^{81}$ are the same or different and are each independently substituted or unsubstituted alkyl, for example —CH$_3$, $R^{82}$ to $R^{85}$ are the same or different and are each independently hydrogen or substituted or unsubstituted alkyl, $n_{49}$, $n_{51}$ and $n_{53}$ are the same or different and are each independently an integer ranging from 1 to 5, $n_{50}$, $n_{52}$ and $n_{54}$ are the same or different and are each independently an integer ranging from 0 to 4, $n_{55}$ is an integer ranging from 1 to 4, and $n_{49}+n_{50}$, $n_{51}+n_{52}$ and $n_{53}+n_{54}$ are the same or different and are each independently an integer of less than or equal to 5.

Examples of the phenol compound may include without limitation 3-hydroxy-4-ethylphenol, 2,6-dimethoxymethyl-4-t-butylphenol, 2,6-dimethoxymethyl-p-cresol, 2,6-diacetoxymethyl-p-cresol, and the like, and combinations thereof.

When the dissolution controlling agent includes the novolac resin and the phenol compound, the novolac resin and the phenol compound may be included at a weight ratio of about 30:5 to about 10:25. In this case, the development sensitivity may not be deteriorated, and the dissolution speed of a non-exposed part can be appropriately increased to provide a good pattern, and it is not precipitated when stored in a freezer to provide excellent storage-stability and to provide high film residue ratio and high sensitivity characteristics. In one embodiment, when the dissolution controlling agent includes the novolac resin and the phenol compound, the novolac resin and the phenol compound may be included at a weight ratio of about 25:10 to about 15:20.

The positive photosensitive resin composition may include the dissolution controlling agent in an amount of about 1 part by weight to about 30 parts by weight, for example about 1 part by weight to about 20 parts by weight, based on about 100 parts by weight of the polybenzoxazole precursor. In some embodiments, the positive photosensitive resin composition may include the dissolution controlling agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of dissolution controlling agent can be in a range from about any of the foregoing amounts to about any other of the foregoing amounts.

When the dissolution controlling agent is included in an amount within the above range, the non-exposed part can be effectively controlled to be non-polar, and the exposed part can be effectively controlled to be polar, so the alkali developability in the exposed part may be effectively controlled.

(C) Photosensitive Diazoquinone Compound

The photosensitive diazoquinone compound may be a compound including a 1,2-benzoquinone diazide or 1,2-naphtoquinone diazide structure.

The photosensitive diazoquinone compound may include the compounds represented by the following Chemical Formulae 42, and 44 to 46, and combinations thereof, but is not limited thereto.

[Chemical Formula 42]

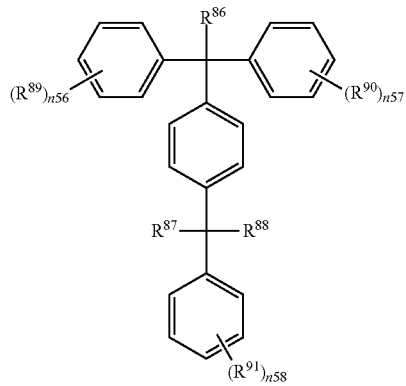

In Chemical Formula 42, $R^{86}$ to $R^{88}$ are the same or different and are each independently hydrogen or substituted or unsubstituted C1 to C30 alkyl, for example CH$_3$.

$R^{89}$ to $R^{91}$ are the same or different and are each independently —OQ, wherein Q is hydrogen, a functional group represented by the following Chemical Formula 43a, or a functional group represented by the following Chemical Formula 43b, provided that all of the Qs are not simultaneously hydrogen. In one embodiment, Q is hydrogen or a functional group represented by the above Chemical Formula 43a.

When Q is a functional group represented by the following Chemical Formula 43a, the photosensitive diazoquinone compound can have photosensitivity with respect to light having a wide range of wavelength including i-line (about 365 nm), h-line (about 405 nm), and g-line (about 436 nm) and thus may be easily used for fabrication of an organic light emitting display device (OLED).

On the other hand, when Q is a functional group represented by the following Chemical Formula 43b, the photosensitive diazoquinone compound can have photosensitivity with respect to light of i-line (about 365 nm), and thus may be easily used for fabrication of a semiconductor device.

$n_{56}$ to $n_{58}$ are each independently an integer ranging from 1 to 3.

[Chemical Formula 43a]

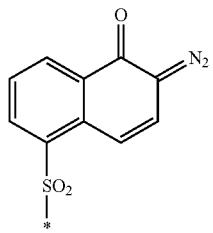

[Chemical Formula 43b]

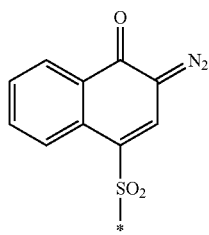

[Chemical Formula 44]

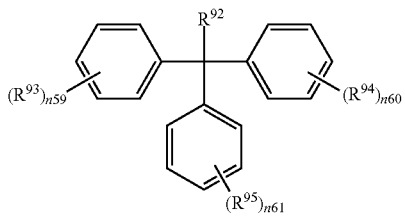

In Chemical Formula 44, $R^{92}$ is hydrogen or substituted or unsubstituted C1 to C30 alkyl, $R^{93}$ to $R^{95}$ are the same or different and are each independently —OQ, wherein Q is the same as defined in the above Chemical Formula 42, and $n_{59}$ to $n_{61}$ are each independently an integer ranging from 1 to 3.

[Chemical Formula 45]

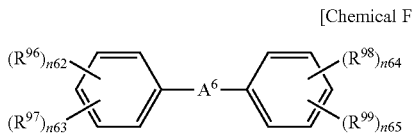

In Chemical Formula 45, $A^6$ is —CO— or wherein $R^{211}$ and $R^{212}$ are the same or different and are each independently substituted or unsubstituted C1 to C30 alkyl, $R^{96}$ to $R^{99}$ are the same or different and are each independently hydrogen, substituted or unsubstituted C1 to C30 alkyl, —OQ or —NHQ, wherein Q is the same as defined in the above Chemical Formula 42, $n_{62}$ to $n_{65}$ are each independently an integer ranging from 1 to 4, $n_{62}+n_{63}$ and $n_{64}+n_{65}$ are each independently an integer of less than or equal to 5, and at least one of $R^{96}$ and $R^{97}$ is —OQ, and one aromatic ring includes one to three OQs and the other aromatic ring includes one to four OQs.

[Chemical Formula 46]

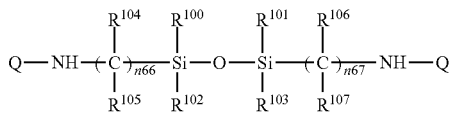

In Chemical Formula 46, $R^{100}$ to $R^{107}$ are the same or different and are each independently hydrogen or substituted or unsubstituted C1 to C30 alkyl, $n_{66}$ and $n_{67}$ are each independently an integer ranging from 1 to 5, and Q is the same as defined in the above Chemical Formula 42.

The positive photosensitive resin composition may include the photosensitive diazoquinone compound in an amount of about 5 parts by weight to about 100 parts by weight, based on about 100 parts by weight of the polybenzoxazole precursor (A). In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed without a residue from exposure, and film thickness loss during development can be prevented and thereby a good pattern can be provided.

(D) Silane Compound

The silane compound can improve adherence between the photosensitive resin composition and a substrate.

Examples of the silane compound may include without limitation compounds represented by the following Chemical Formulae 47 to 49; or a silane compound having a carbon-carbon unsaturated bond such as vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane, and the like, and combinations thereof.

[Chemical Formula 47]

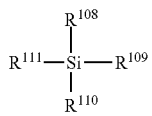

In Chemical Formula 47, $R^{108}$ is a vinyl group, substituted or unsubstituted alkyl, or substituted or unsubstituted aryl, for example 3-(meth)acryloxypropyl, p-styryl, or 3-(phenylamino)propyl, $R^{109}$ to $R^{111}$ are the same or different and are each independently substituted or unsubstituted alkoxy, substituted or unsubstituted alkyl, or halogen, wherein at least one of $R^{109}$ to $R^{111}$ is alkoxy or halogen, and in one embodiment, the alkoxy may be C1 to C8 alkoxy, and the alkyl may be C1 to C20 alkyl.

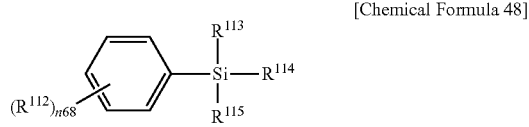

[Chemical Formula 48]

In Chemical Formula 48, $R^{112}$ is —$NH_2$ or —$NHCOCH_3$, $R^{113}$ to $R^{115}$ are the same or different and are each independently substituted or unsubstituted alkoxy, and in one embodiment, the alkoxy is —$OCH_3$ or —$OCH_2CH_3$, and $n_{68}$ is an integer ranging from 1 to 5.

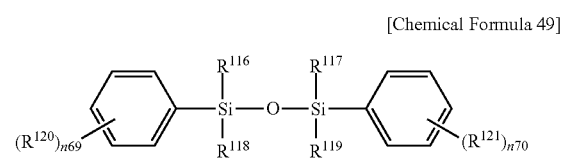

[Chemical Formula 49]

In Chemical Formula 49, $R^{116}$ to $R^{119}$ are the same or different and are each independently substituted or unsubstituted alkyl or substituted or unsubstituted alkoxy, for example —$CH_3$ or —$OCH_3$, $R^{120}$ and $R^{121}$ are the same or different and are each independently substituted or unsubstituted amino, for example —$NH_2$ or —$NHCOCH_3$, and $n_{69}$ and $n_{70}$ are the same or different and are each independently an integer ranging from 1 to 5.

The positive photosensitive resin composition may include the silane compound in an amount of about 0.1 parts by weight to about 30 parts by weight based on about 100 parts by weight of the polybenzoxazole precursor. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the silane compound is included in an amount within the above range, adherence between lower and upper layers can be sufficiently improved, a residual film may not remain after development, and optical properties (transmittance) and mechanical properties such as tensile strength, elongation, and the like may be improved.

(E) Acid Generator

Examples of the acid generator may include without limitation sulfonate-based acid generators such as paratoluene sulfonate, and the like, sulfonic acid-based acid generators such as methane sulfonic acid, and the like, and combinations thereof.

In one embodiment, the acid generator may include sulfonates such as pyridinium paratoluene sulfonate, propargyl paratoluene sulfonate, S-(2-naphthalenecarbonyl methyltetrahydrothiophenium trifluoromethane sulfonenate), triphenylsulfonium triflate, (4-methoxythiophenyl)methylphenyl sulfonium triflate, (4-methylphenyl)diphenyl sulfonium triflate, dimethylphenyl sulfonium nonafluorobutane sulfonate, dimethylphenyl sulfonium trifluoromethane sulfonate, 2-methoxyethyl paratoluene sulfonate, butyl paratoluene sulfonate, and the like, arylsulfonic acids such as p-toluene sulfonic acid, benzene sulfonic acid, and the like, trifluoromethane sulfonic acid, trifluorobutane sulfonic acid, and the like, alkylsulfonic acids such as perfluoroalkyl sulfonic acid, methane sulfonic acid, ethane sulfonic acid, butane sulfonic acid, and the like, and combinations thereof, but is not limited thereto.

The acid generator is a catalyst for a dehydration reaction of the hydroxyl group-containing polyamide of the polybenzoxazole precursor and cyclization reaction, and thus a cyclization reaction can be performed smoothly even if curing temperature is decreased.

The positive photosensitive resin composition may include the acid generator in an amount of about 0.1 to about 20 parts by weight, for example about 0.5 to about 10 parts by weight, and as another example about 1 to about 8 parts by weight, based on about 100 parts by weight of the polybenzoxazole precursor. In some embodiments, the positive photosensitive resin composition may include the acid generator in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 parts by weight. Further, according to some embodiments of the present invention, the amount of the acid generator can be in a range from about any of the foregoing amounts to about any other of the foregoing amounts.

When the acid generator is included in an amount within the above range, the polybenzoxazole precursor may be effectively cyclized and cured enough to improve the film properties. The alkali developability in the exposed part may be improved during the exposition to effectively carry out the patterning.

(F) Solvent

The solvent may be an organic solvent. Examples of the organic solvent may include without limitation N-methyl-2-pyrrolidone, γ-butyrolactone, N,N-dimethylacetamide, dimethylsulfoxide, diethylene glycol dimethylether, diethylene glycol diethylether, diethylene glycol dibutylether, propyleneglycol monomethylether, dipropylene glycol monomethylether, propylene glycol monomethylether acetate, methyl lactate, ethyl lactate, butyl lactate, methyl-1,3-butylene glycol acetate, 1,3-butylene glycol-3-monomethylether, methyl pyruvate, ethyl pyruvate, methyl-3-methoxy propionate, and the like, and combinations thereof. The solvent may be used singularly or as a mixture of two or more.

In one embodiment, the solvent may be a mixed solvent of γ-butyrolactone, ethyl lactate, and propylene glycol monomethylether. As used herein, ethyl lactate may be present in an amount of about 25 to about 60 parts by weight and propylene glycol monomethylether may be present in an amount of about 10 to about 40 parts by weight based on 100 parts by weight of γ-butyrolactone.

The positive photosensitive resin composition may include the solvent in an amount of about 50 parts by weight to about 900 parts by weight, for example about 50 parts by weight to about 600 parts by weight, based on about 100 parts by weight of the polybenzoxazole precursor. When the solvent is used in an amount within the above range, a sufficiently thick film may be obtained, and good solubility and coating can be provided.

(G) Other Additive(s)

The positive photosensitive resin composition according to one embodiment further include (G) one or more other additives.

Non-limiting examples of the additive include suitable surfactants and/or leveling agents, which may be used in order to prevent a stain of the film or to improve development.

Other non-limiting examples of additives may include fluorine-based additives and/or siloxane-based additives.

The process for forming a pattern using a positive photosensitive resin composition may include: coating a positive photosensitive resin composition on a supporting substrate using spin coating, slit coating, inkjet printing, and the like; drying the coated positive photosensitive resin composition to provide a positive photosensitive resin composition layer; exposing the positive photosensitive resin composition layer; developing the positive photosensitive resin composition layer using an alkali aqueous solution to provide a photosensitive resin film; and heating the photosensitive resin film. The conditions of processes to provide a pattern are widely known in this art, so detailed descriptions thereof will be omitted in this specification.

According to another embodiment of the present invention, a photosensitive resin film fabricated using the positive photosensitive resin composition is provided. The photosensitive resin film may be an insulation layer, a buffer layer, or a protective layer.

The photosensitive resin film may have sensitivity of about 100 to about 150 mJ/cm$^2$. Within this range, sensitivity may be increased to improve a yield and reduce a time during processes. In one embodiment, the photosensitive resin film may have sensitivity of about 110 to about 150 mJ/cm$^2$.

According to yet another embodiment of the present invention, a semiconductor device including the photosensitive resin film is provided. The semiconductor device may be an organic light emitting diode (OLED) or a liquid crystal display (LCD).

EXAMPLE

The following examples illustrate the present invention in more detail. However, it is understood that the present invention is not limited by these examples.

Synthesis Example 1

Synthesis of Polybenzoxazole Precursor (PBO-1)

17.4 g of 2,2-bis(3-amino-4-hydroxyphenyl)-1,1,1,3,3,3,-hexafluoropropane is put in a four-necked flask mounted with an agitator, a temperature controlling device, a nitrogen gas injector, and a cooler while nitrogen is passed therethrough, and 280 g of N-methyl-2-pyrrolidone (NMP) is added thereto.

When the solid is completely dissolved, as a catalyst, 9.9 g of pyridine is added thereto. The resultant mixture is maintained at a temperature ranging from 0° C. to 5° C., and a solution prepared by dissolving 13.3 g of 4,4'-oxydibenzoyl-chloride in 142 g of N-methyl-2-pyrrolidone (NMP) is slowly added thereto in a dropwise fashion for 30 minutes. The resulting mixture is reacted for one hour at a temperature ranging from 0° C. to 5° C. and then, heated up to room temperature and reacted for 1 hour. Then, 1.6 g of 5-norbornene-2,3-dicarboxylanhydride is added thereto. The mixture is agitated at room temperature for 2 hours to complete the reaction. The resultant reaction mixture is added to a mixed solution of water/methanol (volume ratio=10/1) to produce a precipitate. The precipitate is filtered, sufficiently cleansed with water, vacuum-dried at 80° C. for more than 24 hours, preparing a polybenzoxazole precursor (PBO-1). The polybenzoxazole precursor (PBO-1) has a weight average molecular weight of 9,800 g/mol.

Synthesis Example 2

Synthesis of Polybenzoxazole Precursor (PBO-2)

23.1 g of 2,2-bis(3-amino-4-hydroxyphenyl)-1,1,1,3,3,3,-hexafluoropropane and 12.4 g of 1-(3,5-diaminophenyl)-3-octadecyl succinimide are put in a four-necked flask mounted with an agitator, a temperature controlling device, a nitrogen gas injector, and a cooler while nitrogen is passed therethrough, and 200 g of N-methyl-2-pyrrolidone (NMP) is added thereto.

When the solid is completely dissolved, as a catalyst, 12.8 g of pyridine is added thereto. The resultant mixture is maintained at a temperature ranging from 0° C. to 5° C., and a solution prepared by dissolving 23.1 g of 4,4'-oxydibenzoyl-chloride in 131 g of N-methyl-2-pyrrolidone (NMP) is slowly added thereto in a dropwise fashion for 30 minutes. The resulting mixture is reacted for one hour at a temperature ranging from 0° C. to 5° C. and then, heated up to room temperature and reacted for 1 hour. Then, 4.0 g of 5-norbornene-2,3-dicarboxylanhydride is added thereto. The mixture is agitated at room temperature for 2 hours to complete a reaction. The resultant reaction mixture is added to a mixed solution of water/methanol (volume ratio=10/1) to produce a precipitate. The precipitate is filtered, sufficiently cleansed with water, vacuum-dried at 80° C. for more than 24 hours, preparing a polybenzoxazole precursor (PBO-1). The polybenzoxazole precursor (PBO-2) has a weight average molecular weight of 9,500 g/mol.

Synthesis Example 3

Synthesis of Polybenzoxazole Precursor (PBO-3)

20.5 g of 2,2-bis(3-amino-4-hydroxyphenyl)-1,1,1,3,3,3,-hexafluoropropane and 9.1 g of 4-octadecoxybenzene-1,3-diamine are put in a four-necked flask mounted with an agitator, a temperature controlling device, a nitrogen gas injector, and a cooler while nitrogen is passed therethrough, and 232 g of N-methyl-2-pyrrolidone (NMP) is added thereto.

When the solid is completely dissolved, as a catalyst, 11.4 g of pyridine is added thereto. The resultant mixture is maintained at a temperature ranging from 0° C. to 5° C., and a solution prepared by dissolving 20.5 g of 4,4'-oxydibenzoyl-chloride in 117 g of N-methyl-2-pyrrolidone (NMP) is slowly added thereto in a dropwise fashion for 30 minutes. The resulting mixture is reacted for one hour at a temperature ranging from 0° C. to 5° C. and then, heated up to room temperature and reacted for 1 hour. Then, 3.5 g of 5-norbornene-2,3-dicarboxylanhydride is added thereto. The mixture is agitated at room temperature for 2 hours to complete a reaction. The resultant reaction mixture is added to a mixed solution of water/methanol (volume ratio=10/1) to produce a precipitate. The precipitate is filtered, sufficiently cleansed with water, vacuum-dried at 80° C. for more than 24 hours, preparing a polybenzoxazole precursor (PBO-3). The polybenzoxazole precursor (PBO-3) has a weight average molecular weight of 9,200 g/mol.

Example 1

Preparation of Positive Photosensitive Resin Composition 4.05 g of the polybenzoxazole precursor (PBO-1) according to Synthesis Example 1 and 0.45 g of polybenzoxazole precursor (PBO-2) according to Synthesis Example 2 are dissolved in 25 g of a mixed solvent of γ-butyrolactone (GBL)/ethyl lactate (EL)/propylene glycol monomethylether (PGME) (weight ratio=5/3/2). 1 g of the photosensitive diazoquinone compound represented by the following Chemical Formula 50, 0.2 g of trimethoxy[3-(phenylamino)propyl]silane represented by the following Chemical Formula 51 as a silane compound, 0.2 g of the compound represented by the following Chemical Formula 52 as a dissolution controlling agent, and 0.2 g of the compound represented by the following Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by the following Chemical Formula 54 as acid generator are added and dissolved therein. The solution is filtered with a 0.45 μm fluorine resin filter, to prepare a positive photosensitive resin composition.

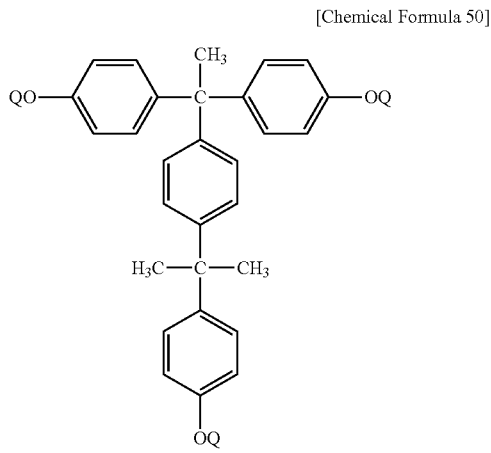

[Chemical Formula 50]

In Chemical Formula 50,

Q is the same as defined in the above Chemical Formula 42, and 67% of Q is substituted with the above Chemical Formula 43a.

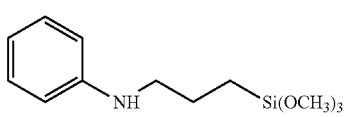

[Chemical Formula 51]

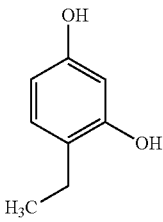

[Chemical Formula 52]

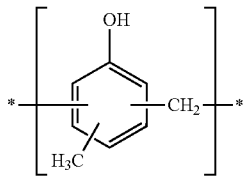

[Chemical Formula 53]

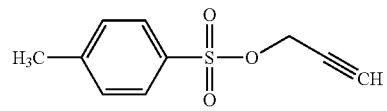

[Chemical Formula 54]

Example 2

Preparation of Positive Photosensitive Resin Composition 3.6 g of the polybenzoxazole precursor (PBO-1) according to Synthesis Example 1 and 0.9 g of polybenzoxazole precursor (PBO-2) according to Synthesis Example 2 are dissolved in 25 g of a mixed solvent of γ-butyrolactone (GBL)/ethyl lactate (EL)/propylene glycol monomethylether (PGME) (weight ratio=5/3/2). 1 g of the photosensitive diazoquinone compound represented by Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, and 0.2 g of the compound represented by Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Example 3

Preparation of Positive Photosensitive Resin Composition 3.15 g of the polybenzoxazole precursor (PBO-1) according to Synthesis Example 1 and 1.35 g of polybenzoxazole precursor (PBO-2) according to Synthesis Example 2 are dissolved in 25 g of a mixed solvent of γ-butyrolactone (GBL)/ethyl lactate (EL)/propylene glycol monomethylether (PGME) (weight ratio=5/3/2). 1 g of the photosensitive diazoquinone compound represented by Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, and 0.2 g of the compound represented by Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Example 4

Preparation of Positive Photosensitive Resin Composition

A positive photosensitive resin composition is prepared according to the same method as in Example 1 except for using the polybenzoxazole precursor (PBO-3) according to Synthesis Example 3 instead of the polybenzoxazole precursor (PBO-2) according to Synthesis Example 2.

Example 5

Preparation of Positive Photosensitive Resin Composition

A positive photosensitive resin composition is prepared according to the same method as in Example 2 except for using the polybenzoxazole precursor (PBO-3) according to Synthesis Example 3 instead of the polybenzoxazole precursor (PBO-2) according to Synthesis Example 2.

Example 6

Preparation of Positive Photosensitive Resin Composition

A positive photosensitive resin composition is prepared according to the same method as in Example 3 except for using the polybenzoxazole precursor (PBO-3) according to Synthesis Example 3 instead of the polybenzoxazole precursor (PBO-2) according to Synthesis Example 2.

Comparative Example 1

Preparation of Positive Photosensitive Resin Composition 4.5 g of polybenzoxazole precursor (PBO-1) according to Synthesis Example 1 is dissolved in 25 g of a mixed solvent of γ-butyrolactone (GBL)/ethyl lactate (EL)/propylene glycol monomethylether (PGME) (weight ratio=5/3/2). 1 g of the photosensitive diazoquinone compound represented by Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, and 0.2 g of the compound represented by Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Comparative Example 2

Preparation of Positive Photosensitive Resin Composition 4.5 g of polybenzoxazole precursor (PBO-1) according to Synthesis Example 1 is dissolved in 25 g of a mixed solvent of γ-butyrolactone (GBL)/ethyl lactate (EL)/propylene glycol monomethylether (PGME) (weight ratio=5/3/2). 1.7 g of the photosensitive diazoquinone compound represented by the above Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, and 0.2 g of the compound represented by Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Comparative Example 3

Preparation of Positive Photosensitive Resin Composition 4.5 g of polybenzoxazole precursor (PBO-1) according to Synthesis Example 1 is dissolved in 25 g of a mixed solvent of γ-butyrolactone (GBL)/ethyl lactate (EL)/propylene glycol monomethylether (PGME) (weight ratio=5/3/2). 1.7 g of the photosensitive diazoquinone compound represented by the above Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, 1.0 g of the compound represented by Chemical Formula 53, including a meta cresol novolac repeating unit and a para cresol novolac repeating unit at a ratio of 6:4, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Comparative Example 4

Preparation of Positive Photosensitive Resin Composition 4.5 g of polybenzoxazole precursor (PBO-1) according to Synthesis Example 1 is dissolved in 25 g of a mixed solvent of γ-butyrolactone (GBL)/ethyl lactate (EL)/propylene glycol monomethylether (PGME) (weight ratio=5/3/2), 1 g of the photosensitive diazoquinone compound represented by Chemical Formula 50, 0.2 g of trimethoxy[3-(phenylamino) propyl]silane represented by Chemical Formula 51 as a silane compound, 0.2 g of the compound represented by Chemical Formula 52 as a dissolution controlling agent, 0.2 g of the compound represented by Chemical Formula 53, including a meta cresol novolac repeating unit and a para cresol novolac repeating unit at a ratio of 2:8, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Comparative Example 5

Preparation of Positive Photosensitive Resin Composition 4.05 g g of the polybenzoxazole precursor (PBO-1) according to Synthesis Example 1 and 0.45 g of polybenzoxazole precursor (PBO-2) according to Synthesis Example 2 are dissolved in 25 g of a mixed solvent of γ-butyrolactone (GBL)/ethyl lactate (EL)/propylene glycol monomethylether (PGME) (weight ratio=5/3/2). 1 g of the photosensitive diazoquinone compound represented by Chemical Formula 50, 0.2 g of trimethoxy[3-(phenylamino)propyl]silane represented by Chemical Formula 51 as a silane compound, 0.2 g of the compound represented by Chemical Formula 52 as a dissolution controlling agent, and 0.2 g of the compound represented by the above Chemical Formula 53, including a meta cresol novolac repeating unit and a para cresol novolac repeating unit at a ratio of 2:8, and having a number average molecular weight of 4,000, and 0.1 g of propargyl paratoluene sulfonate represented by Chemical Formula 54 as acid generator are added and dissolved therein. The solution is filtered with a 0.45 μm fluorine resin filter, to prepare a positive photosensitive resin composition.

Experimental Example 1

Evaluation for Sensitivity, Resolution, Film Residue Ratio, and Scum Generation

The positive photosensitive resin compositions according to Examples 1 to 6 and Comparative Examples 1 to 5 are coated on a 8 inch wafer by using a spin coater (1H-DX2) made by MIKASA Co., Ltd. and then, heated on a hot plate at 120° C. for 120 seconds, forming 4.15 μm-thick polybenzoxazole precursor films.

The photosensitive polybenzoxazole precursor films are sequentially exposed through a mask having various patterns by an I-line stepper (NSR i10C) manufactured by Japan Nikon from 25 mJ/cm² to 400 mJ/cm² at an interval of 5 mJ/cm², dissolved in a 2.38 wt % tetramethyl ammonium hydroxide (TMAH) aqueous solution at room temperature for 60 seconds (2 puddles) to remove the exposed part, and washed with pure water for 30 seconds. Then, the obtained patterns are cured in an oven to cure at 250° C. for 60 minutes, to provide patterned films.

In order to measure sensitivity, the optimal exposure time is determined when a 10 μm L/S (line and space) pattern is formed in a line width of 1 to 1 after exposure and development, and the resolution is determined as the minimum pattern size at the optimal exposure time. The resolution is observed through an optical microscope. The results are shown in the following Table 1.

Because a decrease in the film thickness can affect development and the resulting film thickness, it is preferable that the film thickness is less decreased during development. In order to measure this, the pre-baked film is immersed in a 2.38 wt % tetramethyl ammonium hydroxide (TMAH) aqueous solution for different times and washed with water, so the change of film thickness is measured to calculate the residual film ratio (thickness after development/thickness before development, unit: %). The results are shown in the following Table 2. The film thickness change after pre-baking, development, and curing is measured by using ST4000-DLX equipment manufactured by KMAC Co.

In addition, in order to check the scum generation, the patterned shape is observed by KLA Tencor 8100XP (manufactured by KLA Instruments) CD-SEM (critical dimension scanning electron microscope) equipment and whether residues exist in either the wall surface or the bottom is determined. The results are shown in the following Table 1.

<Evaluation Reference of Scum>
None: no residue on the bottom
Yes: residues on the bottom

TABLE 1

| | Film thickness (μm) | | Film residue ratio (%) | Sensitivity (mJ/cm²) | Resolution (μm) | Scum |
|---|---|---|---|---|---|---|
| | Pre-baking | After development | | | | |
| Example 1 | 4.17 | 3.81 | 91 | 150 | 3 | None |
| Example 2 | 4.10 | 3.66 | 89 | 125 | 2 | None |
| Example 3 | 4.15 | 3.55 | 86 | 115 | 2 | None |
| Example 4 | 4.12 | 3.70 | 90 | 135 | 3 | None |
| Example 5 | 4.15 | 3.69 | 89 | 130 | 2 | None |
| Example 6 | 4.17 | 3.59 | 86 | 110 | 2 | None |
| Comparative Example 1 | 4.11 | 3.07 | 75 | 160 | 3 | None |
| Comparative Example 2 | 4.15 | 3.71 | 89 | 285 | 5 | Yes |
| Comparative Example 3 | 4.12 | 3.50 | 85 | 220 | 4 | Yes |
| Comparative Example 4 | 4.10 | 2.67 | 65 | 160 | 3 | None |
| Comparative Example 5 | 4.15 | 2.93 | 71 | 180 | 3 | Yes |

As shown in Table 1, the positive photosensitive resin compositions according to Examples 1 to 6 including the polybenzoxazole precursor prepared by using hydrophobic diamine and the dissolution controlling agent including a novolac resin having a predetermined structure exhibit an excellent film residue ratio greater than or equal to 86%; scum is not found; and the sensitivity and the resolution are excellent.

On the other hand, the positive photosensitive resin compositions according to comparative Examples 1 to 4 including no polybenzoxazole precursor prepared by using hydrophobic diamine exhibit deteriorated sensitivity. The positive photosensitive resin compositions according to Comparative Examples 1, 3 and 4 exhibit deteriorated film residue ratio; and the positive photosensitive resin compositions according to Comparative Examples 2 and 3 exhibited deteriorated resolution and generated scum.

Particularly, in Comparative Example 2, the amount of a photosensitive diazoquinone compound for suppressing the dissolution to the alkali developing solution is increased in order to improve the film residue ratio which deteriorated in Comparative Example 1. However, although the film residue ratio is improved compared to Comparative Example 1, Comparative Example 2 exhibited deteriorated sensitivity and resolution and generated scum.

Comparative Example 3 include more of the dissolution controlling agent for accelerating the dissolution to the alkali developing solution in order to improve sensitivity and resolution compared to Comparative Example 2. However, Comparative Example 3 exhibited deteriorated film residue ratio and still generated scum although the sensitivity and the resolution are improved compared to Comparative Example 2.

In addition, Comparative Examples 4 and 5 include the compound having a ratio of the meta cresol novolac repeating unit and the para cresol novolac repeating unit of about 2:8 and the number average molecular weight of about 4,000 in order to improve the sensitivity compared to Comparative Examples 2 and 3. However, Comparative Examples 4 and 5 exhibit significantly deteriorated film residue ratio although sensitivity is improved compared to Comparative Examples 2 and 3. While Comparative Example 4 did not generated scum, Comparative Example 5 still generated scum.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising
(A) a polybenzoxazole precursor including a first polybenzoxazole precursor including a repeating unit represented by the following Chemical Formula 1 and a repeating unit represented by the following Chemical Formula 2, and having a thermally polymerizable functional group at at least one of the terminal end;
(B) a dissolution controlling agent including a novolac resin including a repeating unit represented by the following Chemical Formula 4;
(C) a photosensitive diazoquinone compound;
(D) a silane compound;
(E) an acid generator; and
(F) a solvent:

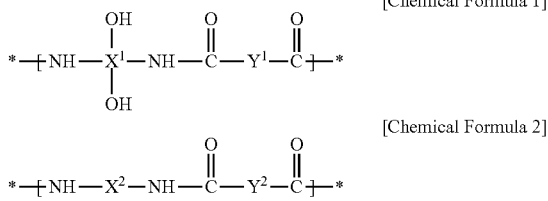

[Chemical Formula 1]

[Chemical Formula 2]

wherein, in Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit, and is independently a functional group represented by the following Chemical Formula 3, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or substituted or unsubstituted divalent to hexavalent C3 to C30 alicyclic organic group,

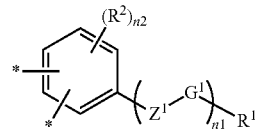

[Chemical Formula 3]

wherein, in Chemical Formula 3, $Z^1$ is the same or different in each repeating unit and is each independently a single bond, —O—, —COO—, —OCO—, —NH—, —CONH—, substituted or unsubstituted C1 to C15 alkylene, substituted or unsubstituted C2 to C15 alkenylene, or substituted or unsubstituted C2 to C15 alkynylene, $G^1$ is the same or different in each repeating unit and is each independently a single bond, a substituted or unsubstituted C6 to C30 aromatic organic group, a substituted or unsubstituted divalent to hexavalent C3 to C30 alicyclic organic group, or a substituted or unsubstituted divalent to hexavalent C2 to C30 heterocyclic group, $R^1$ is the same or different in each repeating unit and is each independently hydrogen, fluorine, a hydroxy group, a thiol group, a substituted or unsubstituted C1 to C30 carboxyl group, or a substituted or unsubstituted C1 to C30 aliphatic organic group, each $R^2$ is the same or different in each repeating unit and is each independently hydrogen, substituted or unsubstituted C1 to C30 alkyl, a substituted or unsubstituted C1 to C30 carboxyl group, a hydroxy group, or a thiol group, n1 is an integer ranging from 1 to 5, and n2 is an integer ranging from 0 to 3,

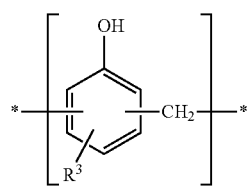

[Chemical Formula 4]

wherein, in Chemical Formula 4, $R^3$ is the same or different in each repeating unit and is each independently a substituted or unsubstituted C1 to C20 aliphatic organic group, wherein greater than or equal to about 50 mol % of $R^3$ based on 100 mol % of $R^3$ in a repeating unit included in the novolac resin is present in a meta position with respect to a hydroxy group (OH).

2. A positive photosensitive resin composition comprising:

(A) a polybenzoxazole precursor including a first polybenzoxazole precursor including a repeating unit represented by the following Chemical Formula 1 and a repeating unit represented by the following Chemical Formula 2, and having a thermally polymerizable functional group at at least one of the terminal end:

[Chemical Formula 1]

$$*+\text{NH}-\overset{\text{OH}}{\underset{\text{OH}}{X^1}}-\text{NH}-\overset{\text{O}}{\underset{}{\text{C}}}-Y^1-\overset{\text{O}}{\underset{}{\text{C}}}+*$$

[Chemical Formula 2]

$$*+\text{NH}-X^2-\text{NH}-\overset{\text{O}}{\underset{}{\text{C}}}-Y^2-\overset{\text{O}}{\underset{}{\text{C}}}+*$$

wherein, in Chemical Formulae 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is independently a functional group represented by represented by the following Chemical Formulae 7 to 14, or a combination thereof:

[Chemical Formula 7]

[Chemical Formula 8]

[Chemical Formula 9]

[Chemical Formula 10]

[Chemical Formula 11]

[Chemical Formula 12]

[Chemical Formula 13]

[Chemical Formula 14]

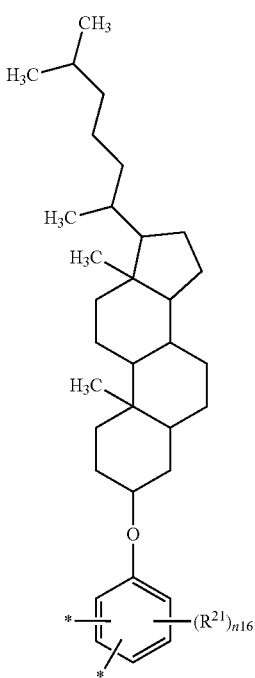

wherein, in Chemical Formulae 7 to 14,
$R^7$, $R^8$, $R^{10}$, $R^{12}$, $R^{14}$, $R^{16}$ and $R^{18}$ are the same or different in each repeating unit and are each independently hydrogen, fluorine, a hydroxy group, a thiol group, a substituted or unsubstituted C1 to C30 carboxyl group, or a substituted or unsubstituted C1 to C30 aliphatic organic group,
$R^9$, $R^{11}$, $R^{13}$, $R^{15}$, $R^{17}$, $R^{19}$, $R^{20}$ and $R^{21}$ are the same or different in each repeating unit and are each independently hydrogen, substituted or unsubstituted C1 to C30 alkyl, a substituted or unsubstituted C1 to C30 carboxyl group, a hydroxy group, or a thiol group,
n9, n11 and n13 are each independently an integer ranging from 0 to 11, and
n6, n7, n8, n10, n12, n14, n15 and n16 are each independently an integer ranging from 0 to 3 and
$Y^1$ and $Y^2$ are the same or different and are each independently a substituted or unsubstituted C6 to C30 aromatic organic group, a substituted or unsubstituted divalent to hexavalent C1 to C30 aliphatic organic group, or substituted or unsubstituted divalent to hexavalent C3 to C30 alicyclic organic group;
(B) a dissolution controlling agent including a novolac resin including a repeating unit represented by the following Chemical Formula 4

[Chemical Formula 4]

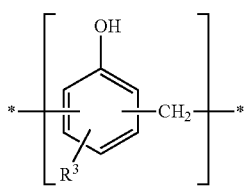

wherein, in Chemical Formula 4,
$R^3$ is the same or different in each repeating unit and is each independently a substituted or unsubstituted C1 to C20 aliphatic organic group, and wherein greater than or equal to about 50 mol % of $R^3$ based on 100 mol % of $R^3$ in a repeating unit included in the novolac resin is present in a meta position with respect to a hydroxy group (OH);
(C) a photosensitive diazoquinone compound;
(D) a silane compound;
(E) an acid generator; and
(F) a solvent.

3. The positive photosensitive resin composition of claim 1, wherein greater than or equal to about 60 mol % of $R^3$ based on 100 mol % of $R^3$ in a repeating unit included in the novolac resin is present in a meta position with respect to a hydroxy group (OH).

4. The positive photosensitive resin composition of claim 1, wherein greater than or equal to about 90 mol % of $R^3$ based on 100 mol % of $R^3$ in a repeating unit included in the novolac resin is present in a meta position and a para position with respect to a hydroxy group (OH).

5. The positive photosensitive resin composition of claim 1, wherein $R^3$ in a repeating unit included in the novolac resin has a mole ratio of $R^3$ present in a meta position ($R^3_m$) and $R^3$ present in a para position ($R^3_p$) of about 5:5 to about 10:0.

6. The positive photosensitive resin composition of claim 1, wherein R3 in a repeating unit included in the novolac resin has a mole ratio of $R^3$ present in a meta position ($R^3_m$) and $R^3$ present in a para position ($R^3_p$) of about 6:4 to about 9:1.

7. The positive photosensitive resin composition of claim 1, wherein the solvent comprises γ-butyrolactone, ethyl lactate and propylene glycol monomethylether.

8. The positive photosensitive resin composition of claim 1, wherein the first polybenzoxazole precursor comprises a repeating unit represented by above Chemical Formula 1 and a repeating unit represented by above Chemical Formula 2 at a mole ratio of about 60:40 to about 95:5.

9. The positive photosensitive resin composition of claim 1, wherein the first polybenzoxazole precursor has a weight average molecular weight (Mw) of about 4,000 g/mol to about 20,000 g/mol.

10. The positive photosensitive resin composition of claim 1, wherein the polybenzoxazole precursor further comprises a second polybenzoxazole precursor including a repeating unit represented by the following Chemical Formula 33, and having a thermally polymerizable functional group at at least one of the terminal end:

[Chemical Formula 33]

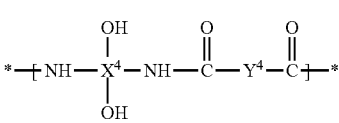

wherein, in Chemical Formula 33,
$X^4$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, and
$Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

11. The positive photosensitive resin composition of claim 10, wherein the second polybenzoxazole precursor has a weight average molecular weight (Mw) of about 4,000 g/mol to about 20,000 g/mol.

12. The positive photosensitive resin composition of claim 10, wherein the polybenzoxazole precursor comprises the first polybenzoxazole precursor and the second polybenzoxazole precursor at a weight ratio of about 5:95 to about 95:5.

13. The positive photosensitive resin composition of claim 1, wherein the positive photosensitive resin composition comprises:
   about 1 part by weight to about 30 parts by weight of the dissolution controlling agent (B);
   about 5 parts by weight to about 100 parts by weight of the photosensitive diazoquinone compound (C);
   about 0.1 parts by weight to about 30 parts by weight of the silane compound (D);
   about 0.1 parts by weight to about 20 parts by weight of the acid generator (E); and
   about 50 parts by weight to about 900 parts by weight of the solvent (F) based on about 100 parts by weight of the polybenzoxazole precursor (A).

14. A photosensitive resin film fabricated the positive photosensitive resin composition according to claim 1.

15. A semiconductor device comprising the photosensitive resin layer according to claim 14.

16. The semiconductor device of claim 15, wherein the semiconductor device is an organic light emitting diode (OLED) or liquid crystal display (LCD).

\* \* \* \* \*

UNITED STATES PATENT AND TRADEMARK OFFICE
CERTIFICATE OF CORRECTION

PATENT NO. : 8,815,489 B2  
APPLICATION NO. : 13/590330  
DATED : August 26, 2014  
INVENTOR(S) : Ji-Young Jeong et al.

Page 1 of 1

It is certified that error appears in the above-identified patent and that said Letters Patent is hereby corrected as shown below:

In the Specification

Column 3, Line 25 reads: "independently a single bond, -O-, -COO-, -COO-,"  
and should read: "independently a single bond, -O-, -COO-, -OCO-,"

Column 9, Line 12 reads: "independently a single bond, -O-, -COO-, -COO-,"  
and should read: "independently a single bond, -O-, -COO-, -OCO-,"

Column 27, Line 61 reads: "$A^6$ is -CO- or wherein $R^{211}$ and $R^{212}$ are the same or"  
and should read: "$A^6$ is -CO- or -$CR^{211}R^{212}$-, wherein $R^{211}$ and $R^{212}$ are the same or"

Signed and Sealed this  
Thirteenth Day of January, 2015

Michelle K. Lee  
*Deputy Director of the United States Patent and Trademark Office*